(12) United States Patent
Easter et al.

(10) Patent No.: US 10,200,001 B2
(45) Date of Patent: Feb. 5, 2019

(54) METHODS AND DEVICES FOR AUTOMATIC GAIN CONTROL

(71) Applicant: Avago Technologies International Sales Pte. Limited, Singapore (SG)

(72) Inventors: Jacob K. Easter, Fort Collins, CO (US); Christopher D. Macchietto, Fort Collins, CO (US); Richard Niescier, Bethlehem, PA (US)

(73) Assignee: AVAGO TECHNOLOGIES INTERNATIONAL SALES PTE. LIMITED, Singapore (SG)

( * ) Notice: Subject to any disclaimer, the term of this patent is extended or adjusted under 35 U.S.C. 154(b) by 86 days.

(21) Appl. No.: 15/266,975

(22) Filed: Sep. 15, 2016

(65) Prior Publication Data
US 2018/0076768 A1 Mar. 15, 2018

(51) Int. Cl.
*H03G 3/30* (2006.01)
*H03B 5/36* (2006.01)
(52) U.S. Cl.
CPC ........... *H03G 3/3036* (2013.01); *H03B 5/364* (2013.01); *H03B 2201/031* (2013.01)

(58) Field of Classification Search
CPC ........ H03B 5/08; H03B 5/30; H03B 2200/00; H03B 2200/0014; H03B 2200/031; H03B 2200/012
See application file for complete search history.

(56) References Cited

U.S. PATENT DOCUMENTS

| 7,277,510 | B1 | 10/2007 | Kilani et al. | |
| 7,508,281 | B2 | 3/2009 | Kobata | |
| 2008/0180185 | A1* | 7/2008 | Fan | H03L 5/00 331/117 R |
| 2014/0070897 | A1* | 3/2014 | Brekelmans | H03B 5/36 331/109 |

FOREIGN PATENT DOCUMENTS

WO 2006/072540 A1 7/2006

\* cited by examiner

*Primary Examiner* — Jeffrey Shin
(74) *Attorney, Agent, or Firm* — Sheridan Ross P.C.

(57) ABSTRACT

At least one example embodiment provides a controller to sample a first signal. The first signal indicates an initial amplitude of an output signal of an oscillator circuit. The controller selects a step amount based on the first signal and a target amplitude of the output signal. The controller generates a control signal for the oscillator circuit based on the selected step amount. The control signal indicates a change in gain for the oscillator circuit according to the selected step amount.

20 Claims, 8 Drawing Sheets

METHODS AND DEVICES FOR AUTOMATIC GAIN CONTROL

FIELD OF THE DISCLOSURE

The present disclosure is generally directed toward methods and devices of Automatic Gain Control (AGC) for oscillator circuits.

BACKGROUND

Oscillators are electronic circuits that output oscillating currents or voltages (e.g., sine waves) by converting a direct current (DC) signal into an alternating current (AC) signal. Oscillator circuits have practical applications in devices that use frequency tuners, filters, modulators, etc. One of these applications includes using an oscillator circuit as part of a start-up circuit for a hard disk drive (HDD) or other storage device in a processing device (e.g., a personal computer). One type of oscillator useful for the startup circuit is a crystal oscillator comprised of a piezoelectric crystal, for example, quartz. In operation, the piezoelectric crystal's frequency of vibration determines the oscillation frequency of the output signal of the oscillator circuit while the amplitude of a DC input signal determines the amplitude of the output signal.

A desirable trait in many modern computers or processing devices is the ability to quickly switch from a reduced power mode (e.g., a sleep mode) to a normal mode. One of the factors that affects this ability to switch between modes is the speed at which the aforementioned startup circuit can "wake up" the storage device from such a reduced power mode.

BRIEF DESCRIPTION OF THE DRAWINGS

The present disclosure is described in conjunction with the appended figures, which are not necessarily drawn to scale.

DETAILED DESCRIPTION

Figure 1:
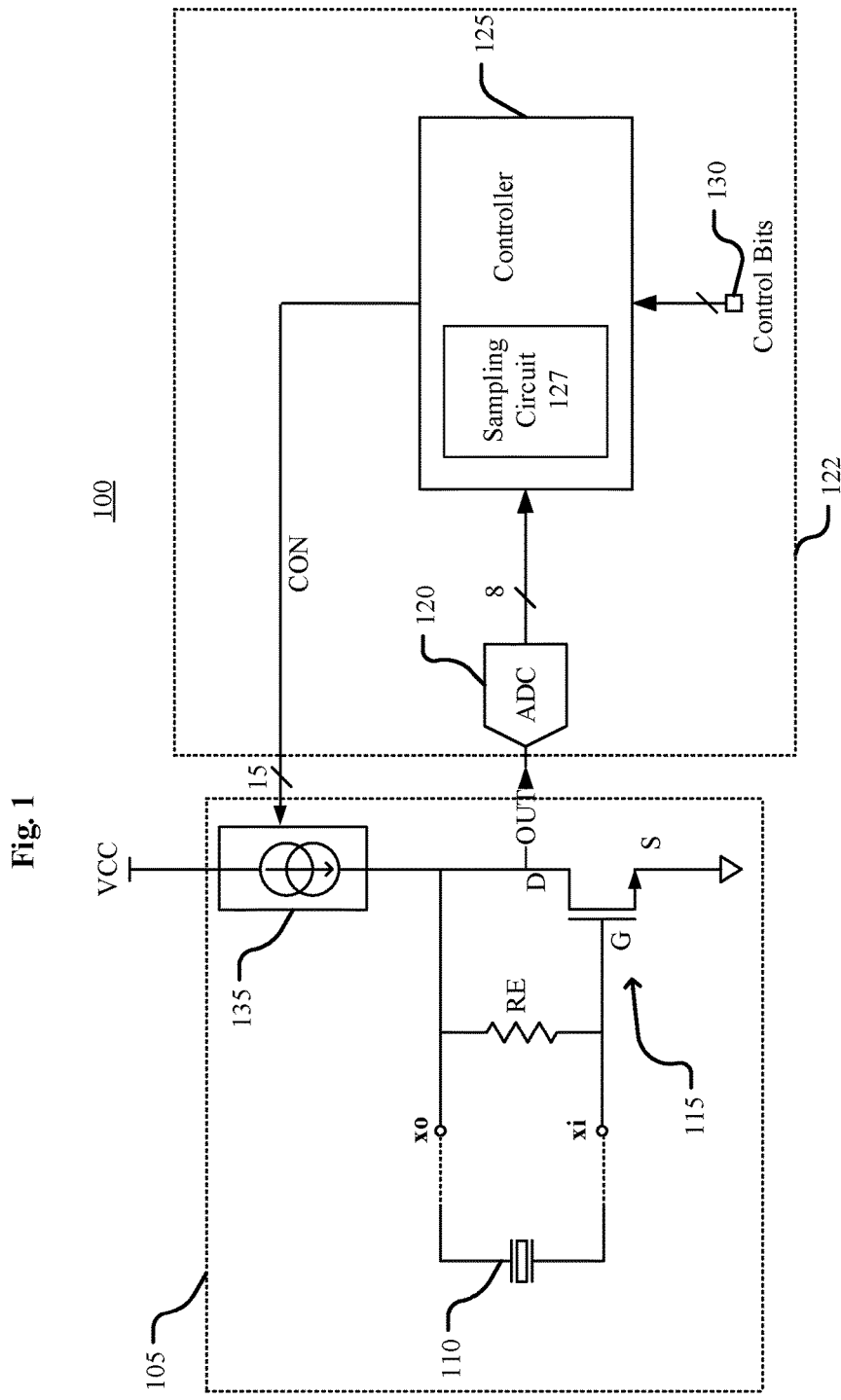
FIG. 1 illustrates a device for automatic gain control of an output signal according to at least one example embodiment.

Crystal oscillators commonly utilize either analog or digital automatic gain control (AGC) in order to strategically limit their oscillation amplitude to desired value for noise and power efficiency. In digital approaches, a state machine is utilized to control the gain of the crystal oscillator until the target amplitude is detected. The amplitude is typically detected with a comparator whose output is tied to the digital AGC circuits. The acquisition time of the AGC loop can be limited by the resolution of the detection circuit and also due to the finite/static nature of the crystal oscillator gain control from the AGC circuit. These limitations extend the effective startup time of the crystal oscillator. Many modern crystal oscillator applications, for example, Deep Core Data (DCD), Peripheral Component Interconnect Express (PCIe), flash memory, and other computer memory systems, require fast startup time in order to provide faster system recovery from low-power modes. Therefore, a solution is needed to improve startup time for crystal oscillators utilized by these systems.

Example embodiments described herein provide enhanced performance in crystal oscillator AGC acquisition time through utilization of one or more of the following aspects: 1) oscillation amplitude detection (e.g., sampling) with a high-resolution analog-to-digital converter (ADC); 2) a digital AGC algorithm that dynamically adjusts the crystal oscillator gain control steps based on how close the detected oscillation amplitude is to the desired target; and/or 3) the digital AGC algorithm that has a programmable sampling frequency of the oscillation amplitude in order to improve (or alternatively, optimize) AGC acquisition time.

The digital ACG algorithm according to at least one example embodiment may dynamically adjust the crystal oscillator gain step size during the AGC servo period. To do so, the AGC algorithm may implement one or more of the following features: 1) a step size based on how close the detected oscillation amplitude is to a desired target (e.g., if the amplitude is far from the target, a large step size is utilized. If the amplitude is close to the target, a smaller step size is used); 2) the utilization of this algorithm is made, in part, possible by the high-resolution ADC; and/or 3) the digital circuits also contain programmable sample interval time adjustment to further improve (or alternatively, optimize) AGC acquisition time while allowing proper loop settling to avoid overshoot and/or ringing in the AGC servo loop.

While embodiments of the present disclosure will primarily be described in connection with oscillators for startup circuits of storage devices, it should be appreciated that example embodiments are not so limited. For example, example embodiments may be used in connection with other oscillator applications that utilize gain control. Embodiments of the present disclosure should not be construed as being limited to memory systems nor should they be construed as being limited to crystal oscillators. Rather, embodiments of the present disclosure can be applied to any type of circuit element or collection of circuit elements that have similar needs for AGC as those described herein.

Various aspects of the example embodiments will be described herein with reference to drawings that are schematic illustrations of idealized configurations. It should be appreciated that while particular circuit configurations and circuit elements are described herein, example embodiments are not limited to the illustrative circuit configurations and/or circuit elements depicted and described herein. Specifically, it should be appreciated that circuit elements of a particular type or function may be replaced with one or multiple other circuit elements to achieve a similar function without departing from the scope of example embodiments.

It should also be appreciated that example embodiments described herein may be implemented in any number of form factors. Specifically, the entirety of the circuits disclosed herein may be implemented in silicon as a fullyintegrated solution (e.g., as a single Integrated Circuit (IC) chip or multiple IC chips) or they may be implemented as discrete components connected to a Printed Circuit Board (PCB).

FIG. 1 illustrates a device for automatic gain control of an output signal OUT according to at least one example embodiment. As shown in FIG. 1, a device 100 includes an oscillator circuit 105 and a feedback circuit 122. The oscillator circuit 105 includes a digital-to-analog converter (DAC) 135, an oscillator 110, a resistive element RE, an amplifier 115. The feedback circuit 122 includes a controller 125, control bits 130, and an analog-to-digital converter (ADC) 120 that receives an output signal OUT of the oscillator circuit 105. Example operations of the device 100 are described in more detail below with reference to FIGS. 3A-6. Hereinafter, the ADC 120 may be referred to as a first converter and the DAC 135 may be referred to as a second converter.

The oscillator 110 is shown as a crystal oscillator comprised of a piezoelectric crystal, for example, quartz. However, example embodiments are not limited to crystal oscillators. For example, the oscillator 110 may be any component or collection of components capable of converting a direct current (DC) signal into an alternating current (AC) signal with a desired magnitude and frequency, such as an RC oscillator or an LC oscillator. In operation, the piezoelectric crystal's frequency of vibration determines a frequency of the output signal OUT of the oscillator 110 while the amplitude of a DC input signal from DAC 135 determines the amplitude of the output signal OUT. Resistive element RE may operate as a currently limiter for the oscillation circuit 105 and may have a resistance value that is a design parameter based on empirical evidence and/or user defined.

The amplifier 115 is shown as an N-type metal oxide semiconductor field effect transistor (MOSFET) and functions to provide the output signal OUT at an amplified level to the ADC 120. It should be understood that example embodiments are not limited to the amplifier 115 being a MOSFET device. For example, the amplifier 115 may be any component or set of components capable of amplifying a signal.

The ADC 120 may be a high resolution ADC capable of converting the (analog) output signal OUT into a first digital signal. If the ADC 120 has an 8-bit resolution, then an amplitude of the output signal OUT may be converted by the ADC 120 into an 8-bit value.

The controller 125 may include a number of circuit components that carry out a series of operations enabling the controller 125 to provide AGC for the oscillator circuit 105. The controller 125 may include a sampling circuit 127 for sampling an output signal OUT of the ADC 120. The controller 125 provides automatic gain control by outputting a control signal CON to the DAC 135. The control signal CON indicates a change in gain for the oscillator circuit 105. The control signal CON may be a second digital signal to control operation of DAC 135. For example, as shown in FIG. 1, the control signal CON may be a 15-bit signal. An example structure and example operations of the controller 125 are discussed below with reference to FIGS. 2, 3A, 3B, and 5.

The DAC 135 is shown to receive an input voltage VCC. In some embodiments, the DAC 135 is designed to convert a digital signal into an analog signal. For example, the DAC 135 converts the digital control signal CON to into an analog power supply signal for the oscillator circuit 103. If the control signal CON is a 15-bit signal, then the DAC has a 15-bit resolution.

An electrical connection of the elements in FIG. 1 will now be described. As shown in FIG. 1, the amplifier 115 includes a source S, a gate G, and a drain D. The source S of the amplifier 115 is shown as being connected to ground, although it should be appreciated that the source can be connected to any common voltage, which may or may not necessarily correspond to a ground node. A first terminal xo of the oscillator 110 is electrically connected to the drain D of the amplifier 115, an input of the ADC 120, and an output of the DAC 135. A second terminal xi of the oscillator 110 is electrically connected to the gate G of the amplifier 115. An output of the ADC 120 is electrically connected to a first input of the controller 125, and an output of the controller 125 is electrically connected to an input of the DAC 135. Control bits 130 are input to the controller 125 via a second input. Alternatively, the control bits 130 are programmed into the controller 125 and readily available for the controller 125 to check. The controller 125 may use the control bits 130 to control a sampling frequency of the sampling circuit 127 to sample the output of the ADC 120 at a desired frequency, and to adjust levels of a plurality of step amounts. Additional details of the control bits 130 are described below with reference to FIGS. 3-5.

Figure 2:
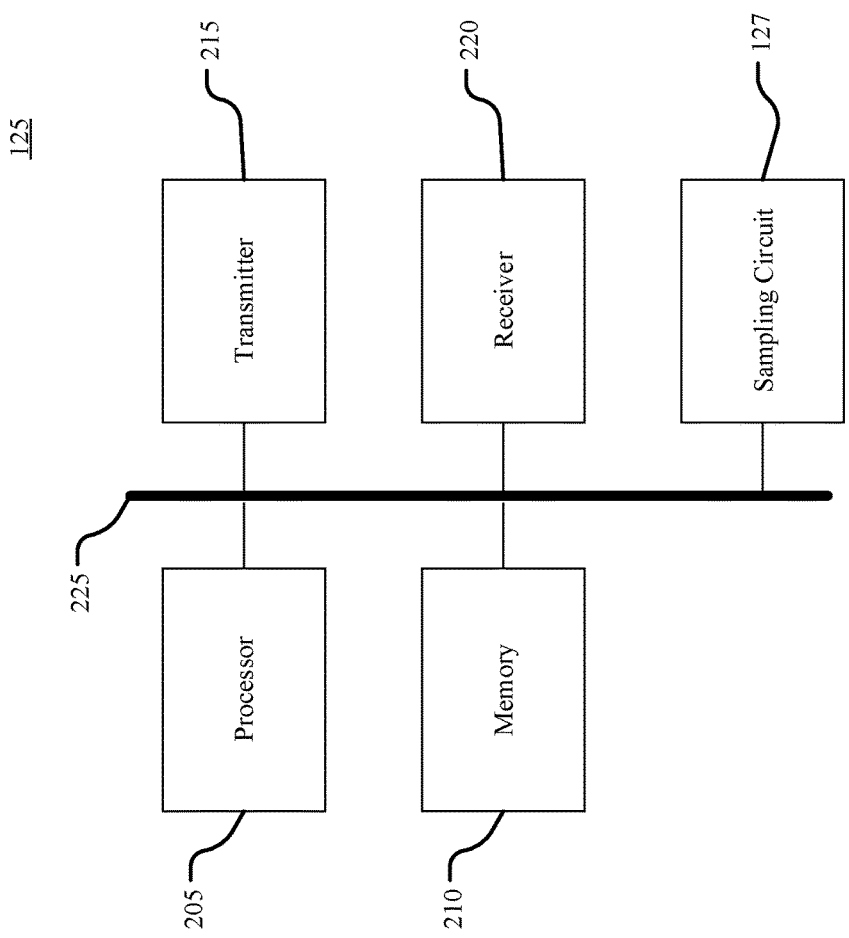
FIG. 2 illustrates an example structure of the controller in FIG. 1 according to at least one example embodiment.

FIG. 2 illustrates an example structure of the controller 125 according to at least one example embodiment. As shown in FIG. 2, the controller 125 may include a processor 205, a memory 210, a transmitter 215, a receiver 220, and a sampling circuit 127 all of which are electrically connected by a data bus 225. The sampling circuit 127 is discussed in further detail below with reference to FIG. 5.

The processor 205 may be special purpose processor for executing computer readable instructions stored on the memory 210. Examples of a suitable processor 205 include, without limitation, an Integrated Circuit (IC) chip, a CPU, a microprocessor, and the like.

The memory 210 may be a computer readable medium for storing the computer readable instructions. The memory 210 may be volatile or non-volatile in nature. Examples of a suitable memory 210 include, without limitation, flash memory, ROM, RAM, EEPROM, etc. The instructions stored in memory 210 may be executed by the processor 205 to carry out the functionality of the control circuit 125 described herein.

The transmitter 215 includes any necessary hardware and/or software for sending data signals, control signals, etc. to external components and the processor 205. The receiver 220 includes any necessary hardware and/or software for receiving data signals, control signals, etc. from external components and the processor 205. Embodiments of the present disclosure contemplate that the transmitter 215 and/or receiver 220 may be configured as simple output/input ports or more complex transmitter/receiver circuits having drivers and other associated circuitry. In some embodiments, the transmitter 215 and receiver 220 are configured to transmit and receive, respectively, signals via wired communications to other elements either via a circuit trace (e.g., via a PCB), an IC trace (e.g., an electrical trace or via established in an IC chip), an external wire, or the like.

It should be understood that example embodiments are not limited to the structure of the controller 125 shown in FIG. 2. For example, the controller 125 may be implemented by a digital state machine comprising digital components such as logic gates. As another example, the controller 125 may be implemented as an application specific integrated circuit (ASIC).

Figure 3A:
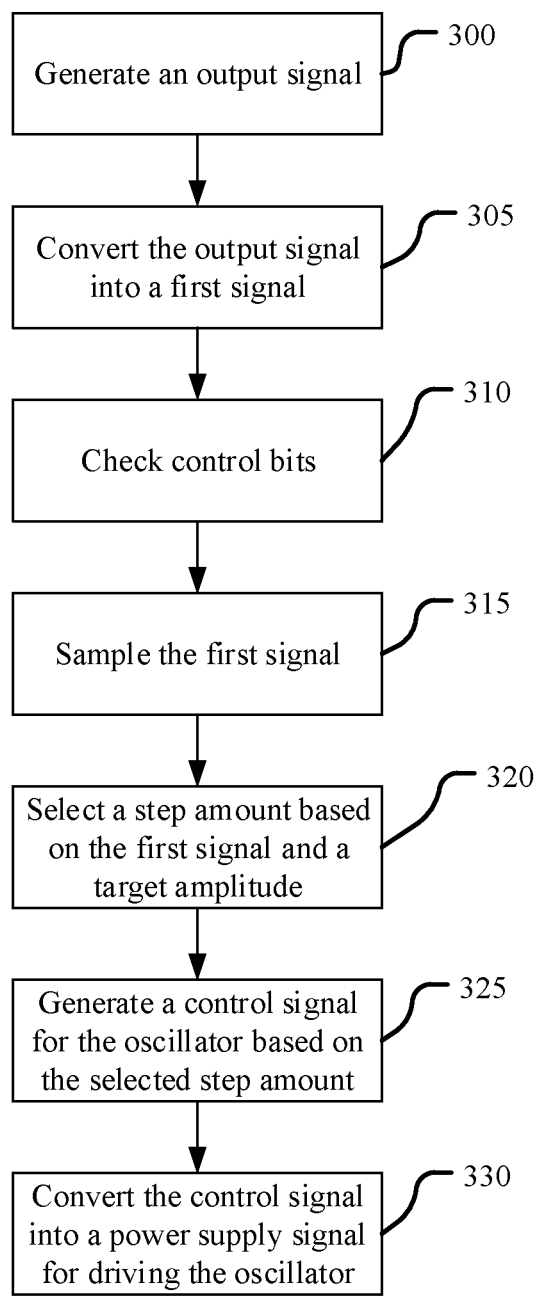
FIG. 3A illustrates a first set of example operations for operating the device of FIG. 1 according to at least one example embodiment.
Figure 3B:
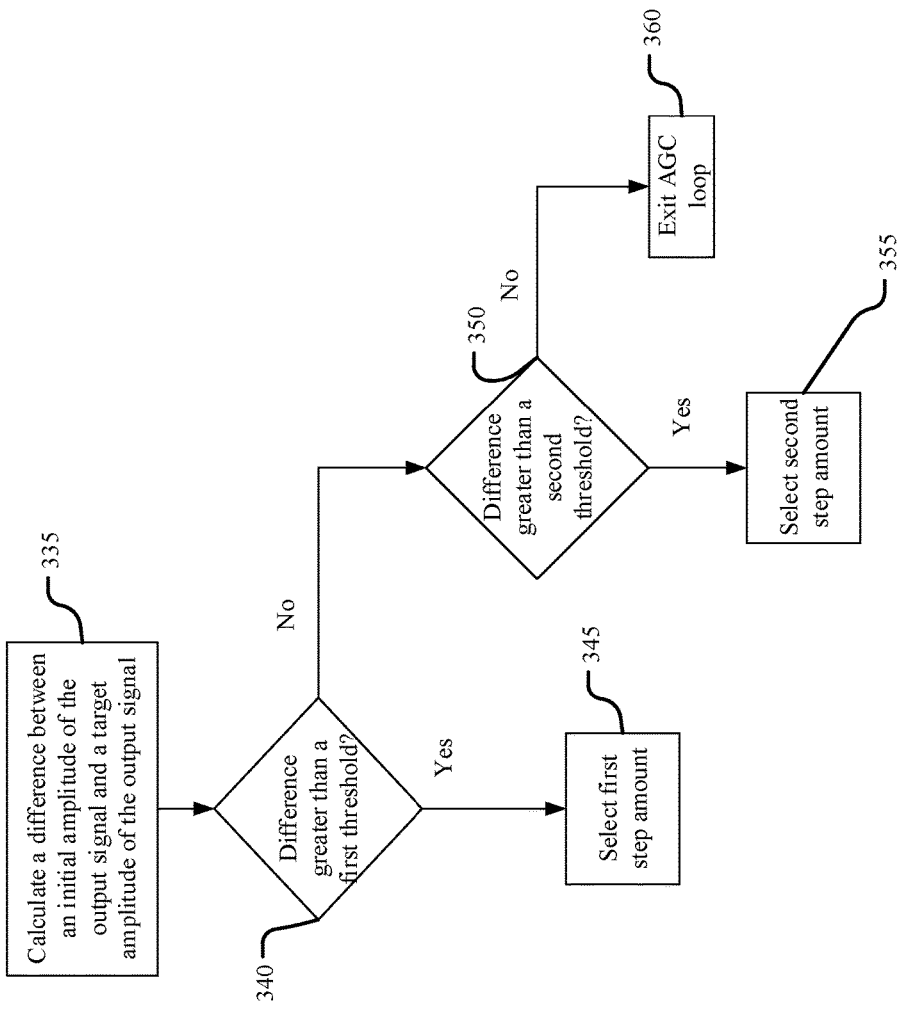
FIG. 3B illustrates a second set of example operations for operating the device of FIG. 1 according to at least one example embodiment.

FIGS. 3A and 3B illustrate example operations for operating the device of FIG. 1 according to at least one example embodiment. For example, the device 100 may iteratively perform the operations of FIGS. 3A and 3B within an automatic gain control AGC loop. Accordingly, FIGS. 3A and 3B are discussed below with reference to FIGS. 1 and 2.

In operation 300, the oscillator circuit 105 generates an output signal OUT. For example, a frequency of vibration of the oscillator 110 determines a frequency of the output signal OUT while the amplitude of a DC signal from DAC 135 determines the amplitude of the output signal OUT.

In operation 305, the ADC 120 converts the analog output signal OUT into a first signal. The first signal indicates an initial amplitude (e.g., current level or voltage level) of the output signal OUT. The first signal may be a digital signal.

In operation 310, the controller 125 checks control bits 130. The controller 125 may use the control bits 130 to sample the output of the ADC 120 at a desired frequency via the sampling circuit 127, and to adjust levels of a plurality of step amounts. The control bits 130 may be a design parameter based on empirical evidence and/or user defined.

In operation 315, the controller 125 samples (e.g., via the sampling circuit 127) the first signal at the desired frequency based on the control bits 130.

In operation 320, the controller 125 selects a step amount based on the first signal and a target amplitude of the output signal OUT. The target amplitude represents a desired (or alternatively, ideal) amplitude of the output signal OUT of the oscillator circuit 105. The target amplitude may be a design parameter based on empirical evidence and/or user defined. According to at least one example embodiment, the target amplitude is a desired amplitude of a clock signal for a storage device. The selection of the step amount is described in more detail below with reference to FIG. 3B.

In operation 325, the controller 125 generates a control signal CON for the oscillator circuit 105 based on the selected step amount. Here, the control signal CON indicates a change in gain for the oscillator circuit 105 according to the selected step amount.

In operation 330, the DAC 135 converts the control signal CON into a power supply signal for the driving oscillator circuit 105. For example, the DAC 135 converts the digital control signal CON into an analog power supply signal that changes the gain of the oscillator circuit 105. For example, the control signal CON may cause the power supply signal to cause the gain of the oscillator circuit 105 to increase or decrease so that an amplitude of output signal OUT approaches the target amplitude.

FIG. 3B illustrates example operations for selecting the step amount in operation 320. In operation 335, the controller 125 calculates a difference between the initial amplitude of the output signal OUT and the target amplitude of the output signal OUT.

In operation 340, the controller 125 determines whether the difference is greater than a first threshold. If so, the controller 125 selects a first step amount from among a plurality of step amounts in operation 345. If not, then the controller 125 determines whether the difference is greater than a second threshold in operation 350, where the second threshold is smaller than the first threshold. If so, the controller 125 selects a second step amount from the plurality of step amounts in operation 355. If not, then the controller 125 exits the automatic gain control (AGC) loop in operation 360. In other words, operation 360 indicates that the controller 125 has determined that the initial amplitude of the output signal OUT is close enough to the target amplitude so that further gain adjustment of the output signal OUT is not useful.

The second step amount may be less than the first step amount. As discussed above, a size of the first step amount and the second step amount may be adjustable by the control bits 130. According to at least one example embodiment, the first step amount is an integer multiple of the second step amount. For example, if the step amounts correspond to changes in current gain on the order of microamperes, then the first step amount may be 30 µA and the second step amount may be 10 µA. The first threshold, the second threshold, the first step amount, and the second step amount may be design parameters based on empirical evidence and/or user defined. For example, the first and second thresholds and the first and second step amounts may be adjusted by the control bits 130.

It should be appreciated that example embodiments are not limited to the above described step amounts and thresholds and that additional step amounts and thresholds are within the scope of example embodiments.

Figure 4:
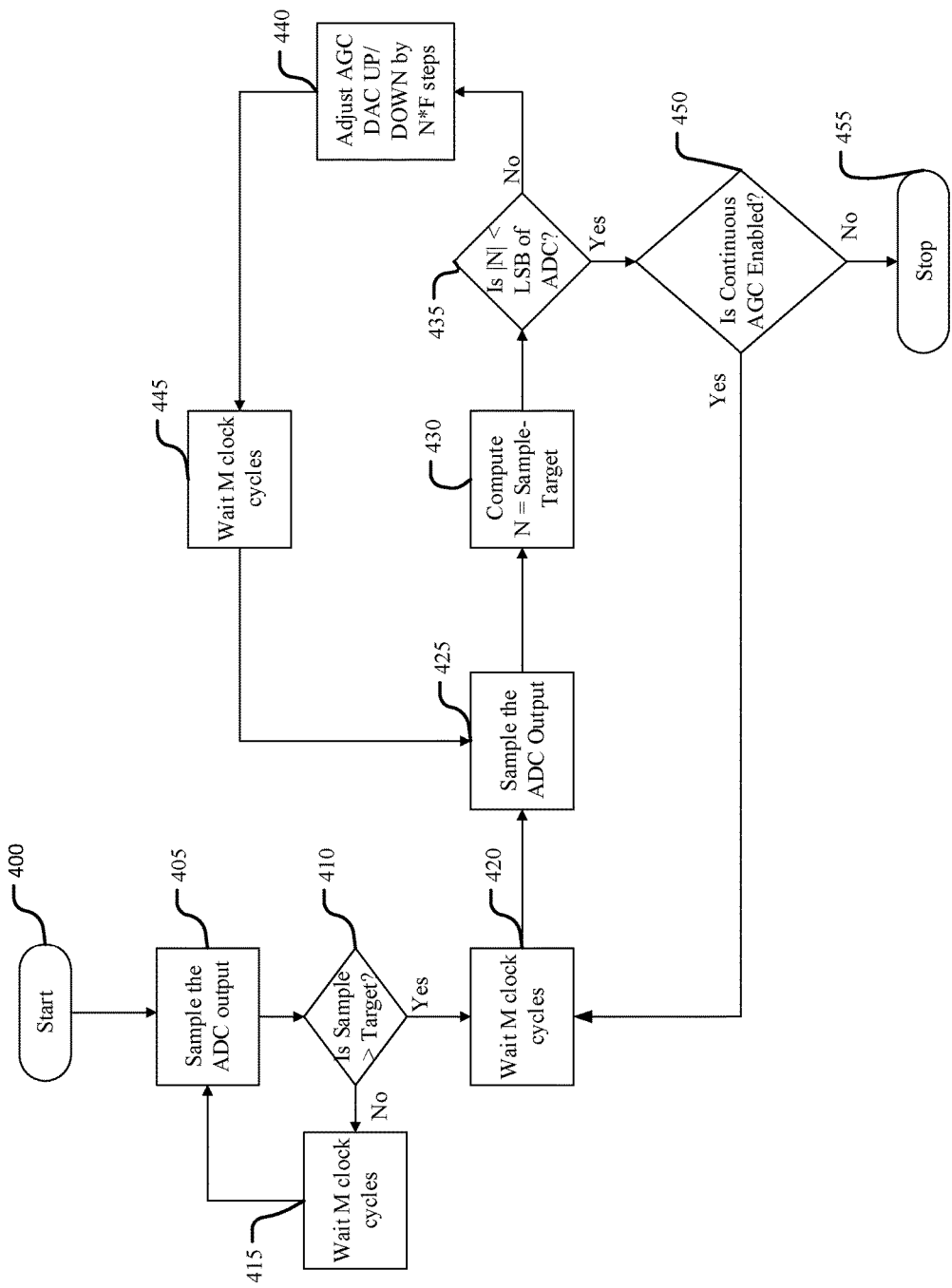
FIG. 4 illustrates example operations for operating the controller of FIG. 1 according to at least one example embodiment.

FIG. 4 illustrates example operations for operating the controller of FIG. 1 according to at least one example embodiment. It should be understood that FIG. 4 illustrates example operations of the controller 125 in an alternative manner compared to FIGS. 3A and 3B. Accordingly, FIG. 4 is described with reference to FIGS. 1-3B. It should be appreciated that operations depicted in FIG. 4 may be performed in addition to or in lieu of operations depicted in FIGS. 3A and/or 3B (or any other operations depicted and described herein).

In operation 400, the controller 125 enters an automatic gain control AGC loop, for example, upon power up of the oscillator circuit 103. It should be understood that the AGC loop can be programmed to loop once or continuously depending upon a type of application in which the controller 125 is situated.

In operation 405, the controller 125 samples (e.g., via the sampling circuit 127) the output of the ADC 120 according to a sampling frequency (e.g., programmable sampling frequency) indicated by the control bits 130.

In operation 410, the controller 125 checks whether a level of the sampled signal is greater than a target level to see if an initial amplitude of the output signal OUT exceeds a target amplitude of the output signal OUT. If not, then the controller 125 waits M clock cycles in operation 415 before returning to operation 405. If so, the controller 125 waits M clock cycles in operation 420 before proceeding to operation 425. Here, M is the programmable sampling frequency of the sampling circuit 127. For example, M is determined by the control bits 130.

In operation 425, the controller 125 again samples the output of ADC 120.

In operation 430, the controller 125 computes a value N, where N represents a difference between the level of the sampled signal and the target level.

In operation 435, the controller 125 determines whether an absolute value of N is less than a least significant bit (LSB) of the ADC 120. If not, then the controller 125 performs operation 440 to generate a control signal CON that will adjust the gain of the oscillator circuit 105 up or down by a step of amount of N*F steps, where F is a programmable scaling factor (i.e., a size of the step amount determined by the control bits 130). In other words, the difference computed in operation 430 is multiplied by a floating point, user programmable, scaling factor F and that value is output as a control signal CON and added to the new gain value of the oscillator circuit 105. The controller 125 then proceeds to wait M clock cycles in operation 445 before returning to operation 425. Thus, the AGC loop continues until the user programmable target level (or target amplitude) is reached. The scaling factor F accumulates from one sample to the next so that gain adjustments of less than 1 tick/sample are obtainable. This allows for less clock jitter in a noisy environment when the device 100 is enabled. Further, the scaling factor F can be adjusted on-the-fly to allow for quick clock adjustments at startup or from a low power setting, to a slow adjustment at other operational times.

If the absolute value of N is not less than the LSB of the ADC 120 in operation 435, then the controller 125 checks to see if a continuous AGC mode is enabled in operation 450. If the continuous AGC mode is enabled, then the controller 125 returns to operation 420 to continue the AGC loop. If not, the controller 125 stops the AGC loop in operation 455.

In view of the above, it should be appreciated that the controller 125 can run in a continuous mode, initially, and then can be switched off and retain its last gain level value. This can be useful when the device 100 starts up in a challenging environment, but should operate steadily during normal operation. The continuous mode of the controller 125 is also useful if the device's 100 environment is expected to change greatly over its operational period and the oscillator circuit 105 is desired to operate within specific margins not obtainable without some sort of AGC.

Figure 5:
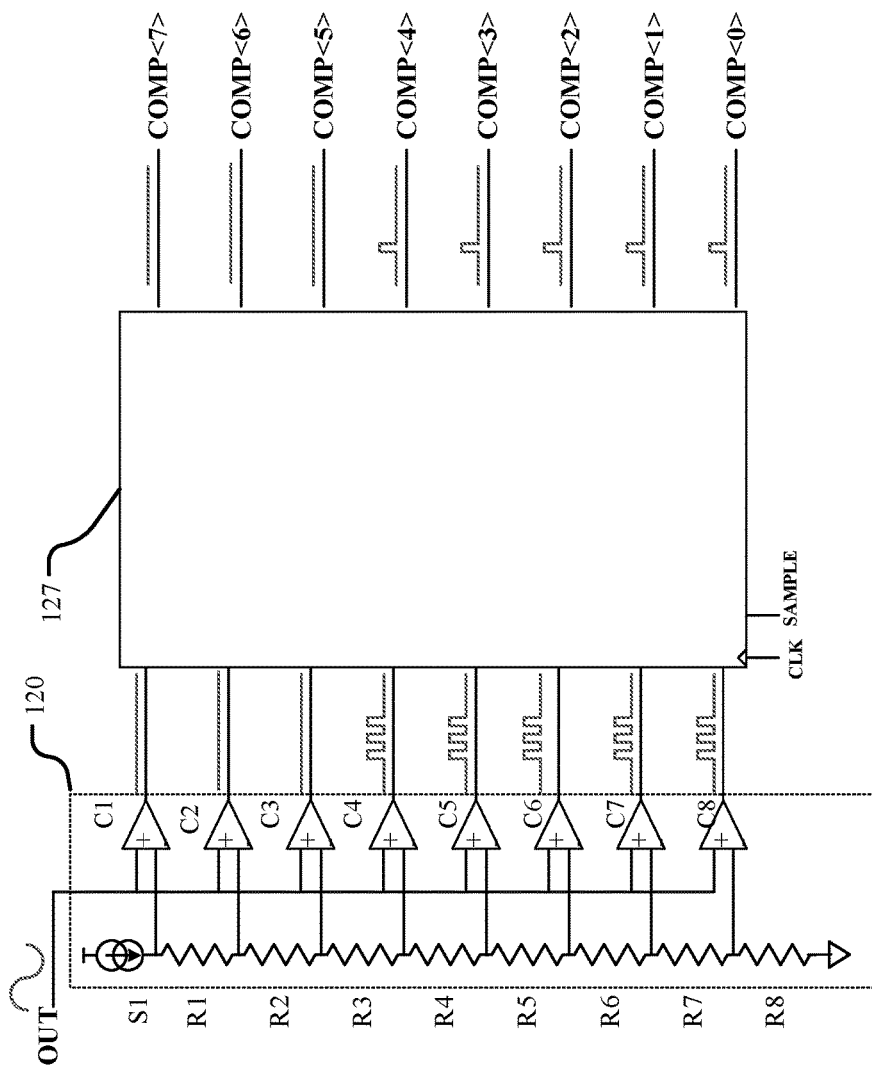
FIG. 5 illustrates an example structure and operation of the analog-to-digital converter and sampling circuit in FIG. 1 according to at least one example embodiment.

FIG. 5 illustrates an example structure of the analog-to-digital converter and a sampling circuit of the controller in FIG. 1 according to at least one example embodiment. Thus, FIG. 5 is described with reference to FIGS. 1-4. It should be appreciated that operations depicted in FIG. 5 may be performed in addition to or in lieu of operations depicted in FIGS. 3A, 3B, and/or 4 (or any other operations depicted and described herein).

As shown in FIG. 5, the ADC 120 includes a power source S1, a plurality of resistors R1 to R8 and a plurality of comparators C1 to C8 to output 8 signals to the sampling circuit 127. In turn, the sampling circuit 127 outputs signals COMP<0> to COMP<7>. Thus, it may be said that the ADC 120 has an 8-bit resolution. It should be apparent from FIG. 5 that the ADC 120 converts the output signal OUT to a thermometer (or unary) encoded value. This value is uniquely averaged/synchronized by the sampling circuit 127 and passed to the controller 125. As a result, the controller 125 experiences reduced conversion noise from the ADC 120.

For example, each bit of the thermometer encoded ADC word is individually averaged, synchronized and then read by the controller 125 after L number of clocks in clock signal CLK. At the start of synchronization, all the ADC 120 output bits are set to zero. Since this is a thermometer encoded word, a test for a binary value 1 is sufficient.

An asynchronous SAMPLE signal from controller 125 resets flops in the sampling circuit 127 and starts testing the ADC 120 thermometer bits. Consider the following example for the output signal OUT from comparator C4. Instead of a data bit going to a D-input of a FLOP, the data bit clocks the FLOP if the data bit is a 1 and sets and holds the output of the FLOP to a 1. This initial FLOP output in sampling circuit 127 is then sampled and used to clock and set another FLOP if the data is still a 1. According to one example embodiment, this happens a total of three times. This effectively averages the ADC output bit at C4 over three cycles of the clock CLK and holds the output to a 1 until the sampling circuit 127 can sample it with sampling signal SAMPLE. This also effectively reduces noise artifacts on the individual ADC thermometer output bits at comparator C4, between the sampling circuit 127 and the controller 125, over the three cycles of the clock CLK and holds the output to a 1 until the controller (125) can sample it with the sampling signal SAMPLE.

Figure 6:
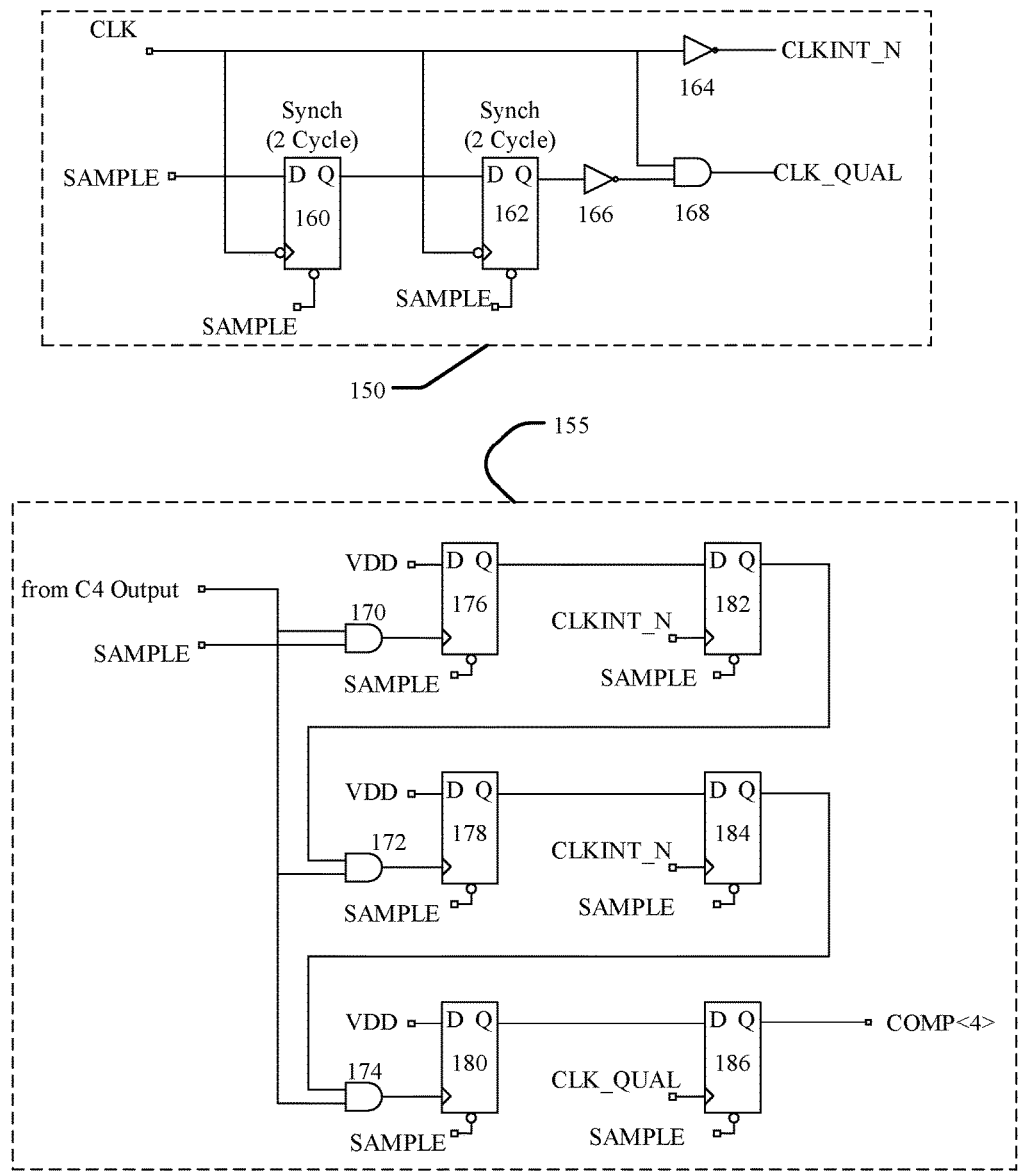
FIG. 6 illustrates an example structure of the sampling circuit of FIGS. 1 and 5.

Since the thermometer data bit is held to a 1 until the controller 125 resets the averaging logic, the controller 125 can clock CLK the output FLOP inside the sampling circuit 127 multiple times to effectively synchronize the output, instead of using multiple flops for the synchronization. Further, the output signal OUT, going to devices outside of this crystal clock generator/AGC clock controller, is blocked to the rest of the devices until the controller 125 reaches the specific user programmable criteria (e.g., until the output signal OUT reaches the target amplitude). FIG. 6 illustrates the above described FLOPS of the sampling circuit 127 in further detail.

If, as a result of the outputs COMP<0> to COMP<7>, the controller 125 is being asked to exceed the oscillator circuit's 103 gain/level range, the controller 125 resamples L more times in case temporary environmental issues corrupted the output signal's OUT amplitude. However, if the controller 125 exceeds a set number of resampling operations, the controller 125 issues a range error and exits the AGC loop without exceeding the gain of the oscillator circuit 103, nor does it disable the clock output enables. This can also happen in single loop mode, in case the operating environment and/or device processing is beyond what the user expected.

FIG. 6 illustrates an example structure of the sampling circuit 127 of FIGS. 1 and 5. It should be understood that FIG. 6 illustrates example circuitry for an output from one of comparators C1-C8 in FIG. 5, for example, comparator C4. As shown in FIG. 6, the sampling circuit 127 includes a clock section 150 and a sampling section 155. It should be understood that the circuitry of the sampling section 155 is an example for producing one of the output signals COMP<0> to COMP<7> based on an output of one of the comparators C1-C8. Thus, FIG. 6 is described with reference to the output of comparator C4 and the output signal COMP<4>. However, it should be understood that the sampling section 155 is repeated for all other outputs of comparators C1-C3 and C5-C8 in FIG. 5. Meanwhile, the outputs of the clock section 150 (i.e., first internal clock signal CLK_QUAL and second internal clock signal CLKINT_N) are used for the sampling sections of the remaining comparators C1-C3 and C5-C8. It should further be understood that the illustrated circuitry accomplishes the effects of the sampling circuit 127 described with respect to FIG. 5.

The clock section 150 includes flip flops 160 and 162, inverters 164 and 166, and a logic gate 168. The flip flops 160 and 162 may be D flip flops or other logic components that achieve the same effect. The logic gate 168 may be an AND gate or other logic component(s) that achieves the same effect. The clock signal CLK and the sampling signal SAMPLE are inputs of the flip flop 160. For example, the clock signal CLK may be input into a clock input of the flip flop 160 and the sampling signal SAMPLE may be input into a D input of the flip flop 160. The flip flop 162 may receive clock signal CLK at a clock input and receive an output Q of the flip flop 160 at a D input. An output Q of the flip flop 162 is input into inverter 166. An output of the inverter 166 and the clock signal CLK are inputs of logic gate 168. An output of the logic gate 168 serves as a first internal clock signal CLK_QUAL. A second internal clock signal CLKINT_N is produced by inverting the clock signal CLK at inverter 164.

The sampling section 155 includes logic gates 170, 172, and 176 and flip flops 182, 184, and 186. The logic gates 170, 172, and 176 may be AND gates or other logic components that achieve the same effect. The flip flops 182, 184, and 186 may be D flip flops or other logic components that achieve the same effect. A voltage VDD is applied to all D inputs of flip flops 176, 178, and 180.

An output from comparator C4 and the sampling signal SAMPLE are input into logic gate 170. An output of the logic gate 170 is input as a clock signal of the flip flop 176 while a supply voltage VDD is input to the D input of the flip flop 176. An output Q of the flip flop 176 is received by a D input of flip flop 182 while the second internal clock signal CLKINT_N is input into the clock input of flip flop 182.

An output Q of flip flop 182 is input into logic gate 172 along with the output from comparator C4. An output of the logic gate 172 serves as a clock input of the flip flop 178. An output Q of the flip flop 178 serves as the D input of the flip flop 184 while the second internal clock signal CLKINT_N serves as the clock input of the flip flop 184.

An output Q of the flip flop 184 is input into the logic gate 174 along with the output of comparator C4. An output of the logic gate 174 serves as a clock input of the flip flop 180.

An output Q of the flip flop 184 serves as a D input of the flip flop 186 while the first internal clock signal CLK_QUAL serves as the clock input of the flip flop 186.

An output Q of the flip flop 186 is the output signal COMP<4> of the sampling circuit 127.

As also shown in FIG. 6, the sampling signal SAMPLE may serve as a reset signal for the flip flops 160, 162, 176, 178, 180, 182, 184, and 186 (e.g., at an inverted input of the flip flops).

Figure 7:
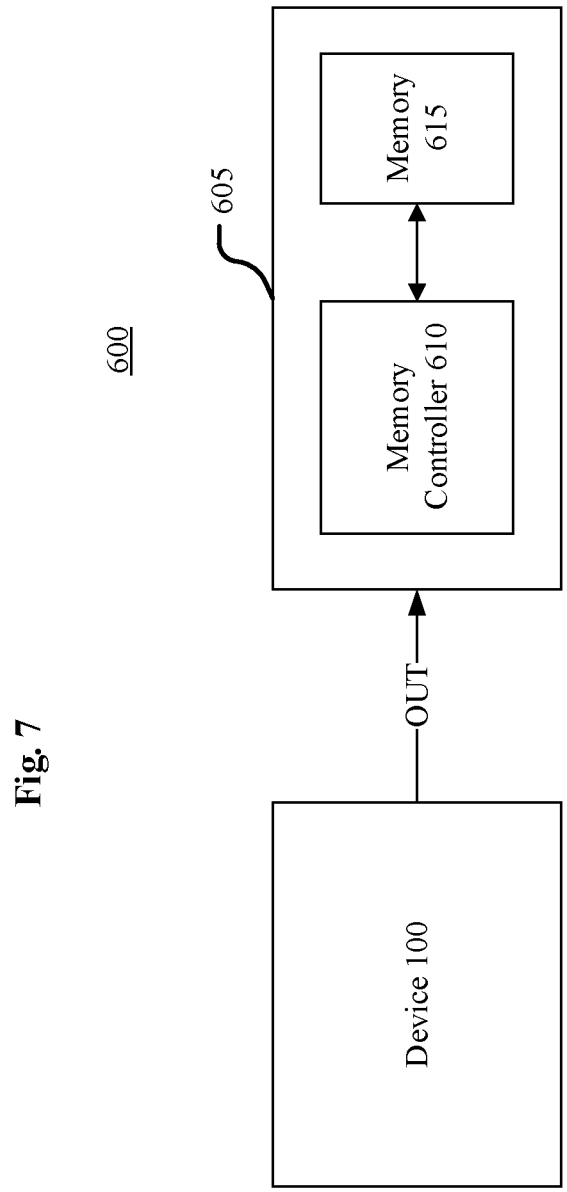
FIG. 7 illustrates a system including the device of FIG. 1 according to at least one example embodiment.

FIG. 7 illustrates a system including the device of FIG. 1 according to at least one example embodiment. As shown in FIG. 7, a system 600 includes the device 100 and a storage device 605. The system 600 may be a personal computer, smart phone, or other processing device capable of operating in a normal mode and one or more reduced power modes (e.g., a sleep mode). The storage device 605 may include a memory controller 610 and a memory 615. The memory 615 may be, for example, a nonvolatile memory array including one or more magnetic hard disk drives (HDDs) or other storage drives. The nonvolatile memory array may have a redundant array of independent disks (RAID) configuration. As shown in FIG. 7, the device 100 may output the output signal OUT to the storage device 605. The output signal OUT may be used as a clock signal for the memory controller 610 to control, for example, a timing of read/write operations for the memory 615. Thus, due to the above described operations of the device 100, the speed at which the storage device "wakes up" from a reduced power mode, such as a sleep mode, may be improved.

In view of the foregoing description, it should be appreciated that example embodiments provide improved devices and methods for automatic gain control of an oscillator circuit in that a target amplitude of an oscillator circuit's output signal OUT may be quickly achieved and maintained with low power consumption.

Specific details were given in the description to provide a thorough understanding of the embodiments. However, it will be understood by one of ordinary skill in the art that the embodiments may be practiced without these specific details. In other instances, well-known circuits, processes, algorithms, structures, and techniques may be shown without unnecessary detail in order to avoid obscuring the embodiments.

While illustrative embodiments of the disclosure have been described in detail herein, it is to be understood that the inventive concepts may be otherwise variously embodied and employed, and that the appended claims are intended to be construed to include such variations, except as limited by the prior art.

What is claimed is:

1. A controller operable to:
    check control bits;
    sample a first signal at a frequency that is indicated by the checked control bits, the first signal indicating an initial amplitude of an output signal of an oscillator circuit;
    select a step amount based on the sampled first signal and a target amplitude of the output signal; and
    generate a control signal for the oscillator circuit based on the selected step amount, the control signal indicating a change in gain for the oscillator circuit according to the selected step amount.

2. The controller of claim 1, operable to select the step amount from among a plurality of step amounts including at least a first step amount and a second step amount, the first step amount being greater than the second step amount.

3. The controller of claim 2, operable to select the first step amount when a difference between the initial amplitude and the target amplitude is greater than a first threshold.

4. The controller of claim 3, operable to select the second step amount when the difference is less than the first threshold and greater than a second threshold, wherein the second threshold is smaller than the first threshold.

5. The controller of claim 2, wherein the first step amount is an integer multiple of the second step amount.

6. The controller of claim 1, operable to:
    adjust levels of the plurality of step amounts based on the checked control bits.

7. A device comprising:
    an oscillator circuit operable to generate an output signal;
    a first converter operable to convert the output signal into a first signal, the first signal indicating an initial amplitude of the output signal; and
    controller operable to,
        check control bits,
        sample the first signal at a frequency that is indicated by the checked control bits,
        select a step amount based on the sampled first signal and a target amplitude of the output signal, and
        generate a control signal for the oscillator circuit based on the selected step amount, the control signal indicating a change in gain for the oscillator circuit according to the selected step amount.

8. The device of claim 7, wherein the oscillator circuit includes a crystal oscillator, wherein the first signal is a digital signal, and wherein the controller is operable to:
    determine a difference between a level of the sampled first signal and a target level, the target level being based on the target amplitude; and
    determine that an absolute value of the difference is not less than a least significant bit (LSB) of the sampled first signal, and in response, select the step amount as a value equal to a product of the absolute value and a scaling factor, wherein the scaling factor is indicated by the control bits.

9. The device of claim 7, further comprising:
a second converter operable to convert the control signal into a power supply signal for the driving oscillator circuit; and
a transistor including a source, a gate, and a drain, wherein,
   a first terminal of the oscillator circuit is electrically connected to the drain, an input of the first converter and an output of the second converter,
   a second terminal of the oscillator circuit is electrically connected to the gate.

10. The device of claim 9, wherein,
an output of the first converter is electrically connected to a first input of the controller,
an output of the controller is electrically connected to an input of the second converter, and
the first converter is an analog to digital converter and the second converter is digital to analog converter.

11. The device of claim 9, wherein the controller is operable to select the step amount from among a plurality of step amounts including at least a first step amount and a second step amount, the first step amount being greater than the second step amount.

12. The device of claim 11, wherein the controller is operable to,
select the first step amount if a difference between the initial amplitude and the target amplitude is greater than a first threshold, and
select the second step amount if the difference is less than the first threshold and greater than a second threshold, wherein the second threshold is smaller than the first threshold.

13. The device of claim 12, wherein,
the first converter and the second converter have at least 8-bit resolutions such that the first signal and the control signal are at least 8-bit digital signals, and each of the difference, the first threshold, and the second threshold is represented as an 8-bit value.

14. The device of claim 11, wherein the first step amount is an integer multiple of the second step amount.

15. The device of claim 7, wherein the controller is operable to:
adjust levels of the plurality of step amounts based on the checked control bits.

16. A method, comprising:
checking control bits;
sampling a first digital signal at a frequency indicated by the checked control bits, the first digital signal indicating an initial amplitude of an output signal of an oscillator circuit;
selecting a step amount based on the first digital signal and a target amplitude of the output signal; and
generating a second digital signal based on the selected step amount, the second digital signal indicating a change in gain for the oscillator circuit according to the selected step amount.

17. The method of claim 16, wherein the selecting selects the step amount from among a plurality of step amounts including at least a first step amount and a second step amount, the first step amount being greater than the second step amount.

18. The method of claim 17, wherein the selecting selects the first step amount when a difference between the initial amplitude and the target amplitude is greater than a first threshold.

19. The method of claim 18, wherein the selecting selects the second step amount when the difference is less than the first threshold and greater than a second threshold, wherein the second threshold is smaller than the first threshold.

20. The method of claim 17,
wherein the checked control bits control levels of the plurality of step amounts.

* * * * *